United States Patent [19]

Grebe et al.

[11] 4,379,218

[45] Apr. 5, 1983

[54] FLUXLESS ION BEAM SOLDERING PROCESS

[75] Inventors: Kurt R. Grebe, Beacon; James M. E. Harper, Yorktown Heights, both of N.Y.

[73] Assignee: International Business Machines Corporation, Armonk, N.Y.

[21] Appl. No.: 278,964

[22] Filed: Jun. 30, 1981

[51] Int. Cl.³ .............................................. B23K 15/00
[52] U.S. Cl. ....................... 219/121 ED; 219/121 EM; 228/205; 228/180 A
[58] Field of Search ............... 219/121 EC, 121 ED, 219/121 EB, 121 EM, 121 EL; 228/205, 180 A, 221, 116

[56] References Cited

U.S. PATENT DOCUMENTS

| | | | |
|---|---|---|---|
| 3,294,951 | 12/1966 | Olson | 219/117 |
| 3,480,755 | 11/1969 | Beesley et al. | 219/121 ED |
| 3,500,532 | 3/1970 | Lozano et al. | 228/116 |
| 4,245,768 | 1/1981 | Sater | 228/205 X |

OTHER PUBLICATIONS

R. J. Herdzik et al, "Ion Milling Technique to Reflow Solder Pads", IBM Technical Disclosure Bulletin, vol. 23, No. 11, Apr. 1981, p. 4915.

*Primary Examiner*—C. L. Albritton
*Attorney, Agent, or Firm*—Hansel L. McGee; John J. Goodwin

[57] ABSTRACT

A method for fluxlessly joining members having relatively low melting materials is provided. The members to be joined are exposed to ion beam radiation of sufficient intensity and a time sufficient to cause cleaning of the low melting materials after cooling. The members are then placed into juxtaposition with each other and again exposed to ion beam radiation of an intensity and for a time sufficient to cause reflow of the low melting materials which upon cooling joins said members.

8 Claims, 8 Drawing Figures

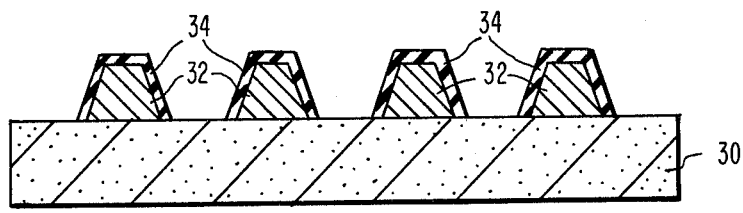
FIG. 2.1
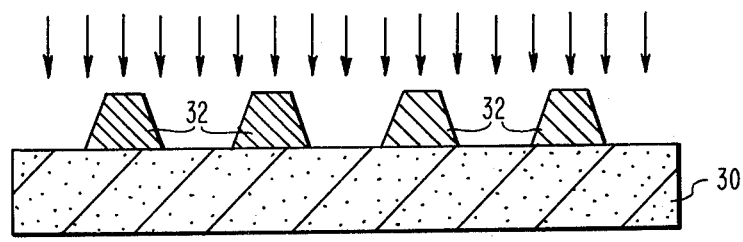
FIG. 2.2
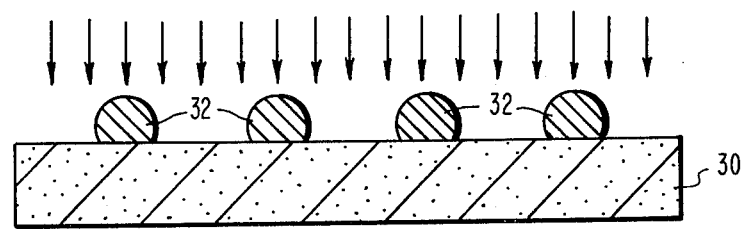
FIG. 2.3
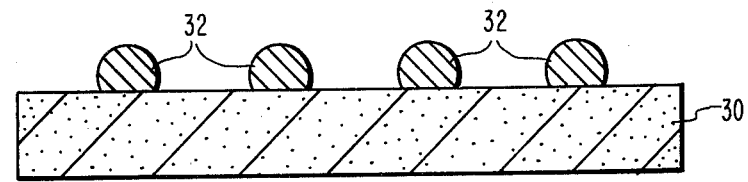
FIG. 2.4

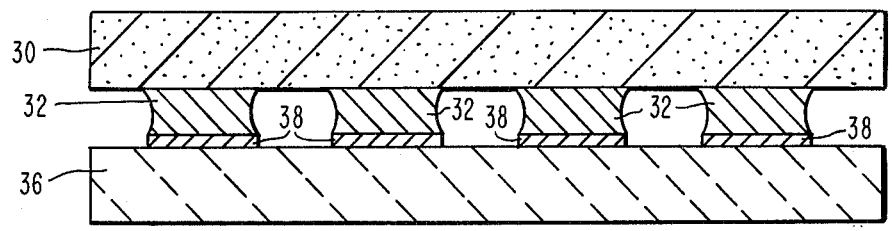
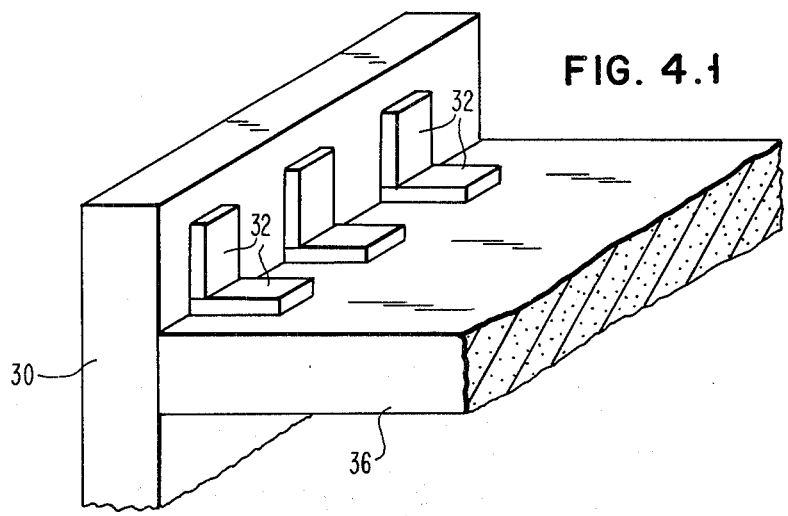
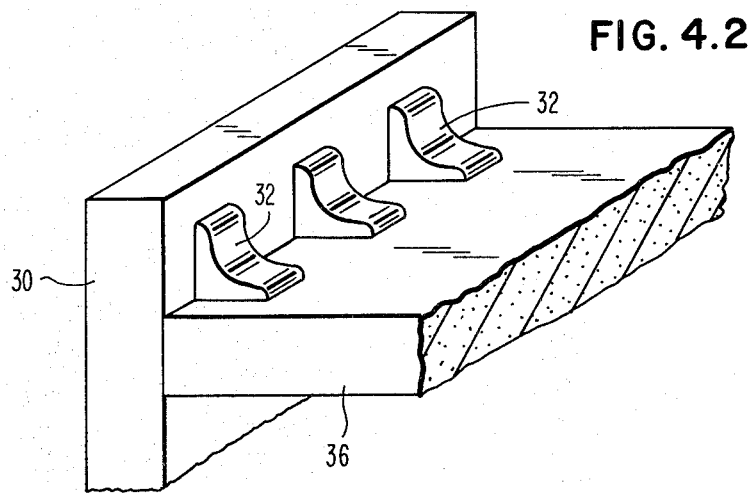

FLUXLESS ION BEAM SOLDERING PROCESS

BACKGROUND OF THE INVENTION

1. Field of the Invention

The invention relates to a fluxless joining process utilizing ion beam milling and reflow techniques.

2. Prior Art

In the preparation of present day large scale integration technology, both for semiconductor and Josephson type devices, it is necessary to interconnect circuit chips to a substrate. Normally, solder joints are used in order to make these interconnections. The present day procedure entails the placement of solder pads on the chip which are to be joined to metal or solder pads which have been established in the substrate. The solder pads are treated with a wet chemical flux in order to dissolve surface oxide which forms thereon. The flux treatment serves to permit solder flow upon heating.

This prior art method has a severe drawback in that the flux is most difficult to remove and remanents thereof remain as a corrosive contaminant. Additionally, to join the flux treated solder pads it is necessary to heat the entire chip assembly.

More recently, it has been recognized that surface oxide can be removed from solder pads by means other than the use of chemical fluxes. For example, in the publication to R. J. Herdizik et al., IBM Technical Disclosure Bulletin, Vol. 23, #11, April 1981, it is recognized that ion milling can be used to effect solder milling i.e., removal of the oxide film. The so treated solder is then heated on a heating stage to effect solder reflow.

In U.S. Pat. No. 3,294,951 to K. O. Olson, there is described a method for micro-soldering using a finely focused electron beam. This method cannot be used for large scale integration as contemplated by the present invention. This method cannot separately remove oxides and cause solder reflow, as well as it cannot be used to cover large areas simultaneously. Additionally, because electron beams are highly energized, they can be damaging to sensitive components.

SUMMARY OF THE INVENTION

What has been discovered here is that a method for fluxless joining on a large scale is obtained through the use of ion beam techniques. The joining of solder or metal pads can be effected in a single step or in a two step process depending upon the control of the ion beam radiation.

In summary the process can be defined as follows:
(a) providing chips and a substrate to which said chips are to be joined with joining pads;
(b) abutting said chips and substrates so that said joining pads to be joined are aligned, and
(c) exposing said joining pads to ion beam radiation whereby metal flow is effected to join said joining pads.

In an alternative embodiment of the invention the method can be characterized as;
(a) providing chips and substrates, to which said chips are to be joined with joining pads;
(b) exposing said joining pads to ion beam radiation to remove oxide films therefrom;
(c) removing said joining pads from said ion beam radiation;
(d) positioning said chips onto said substrate to match said joining pads to be joined; and
(e) exposing said chips to ion beam radiation of sufficient energy to cause metal reflow whereby said joining pads are joined.

OBJECTS OF THE INVENTION

It is an object of the invention to provide an improved method for fluxless joining.

It is another object of the invention to provide an improved method for fluxless joining utilizing ion beam radiation.

BRIEF DESCRIPTION OF THE DRAWINGS

FIGS. 2.1 through 2.4 are a series of schematic drawings depicting the progressive effect that ion beam irradiation has on solder pads.

FIG. 3 is a schematic drawing depicting a chip joined to a substrate according to one embodiment of the invention.

FIGS. 4.1 and 4.2 are schematic drawings which illustrate the steps in the method of a chip joined to a substrate in accordance with a second embodiment of the invention.

DESCRIPTION OF THE PREFERRED EMBODIMENT

Figure 1:
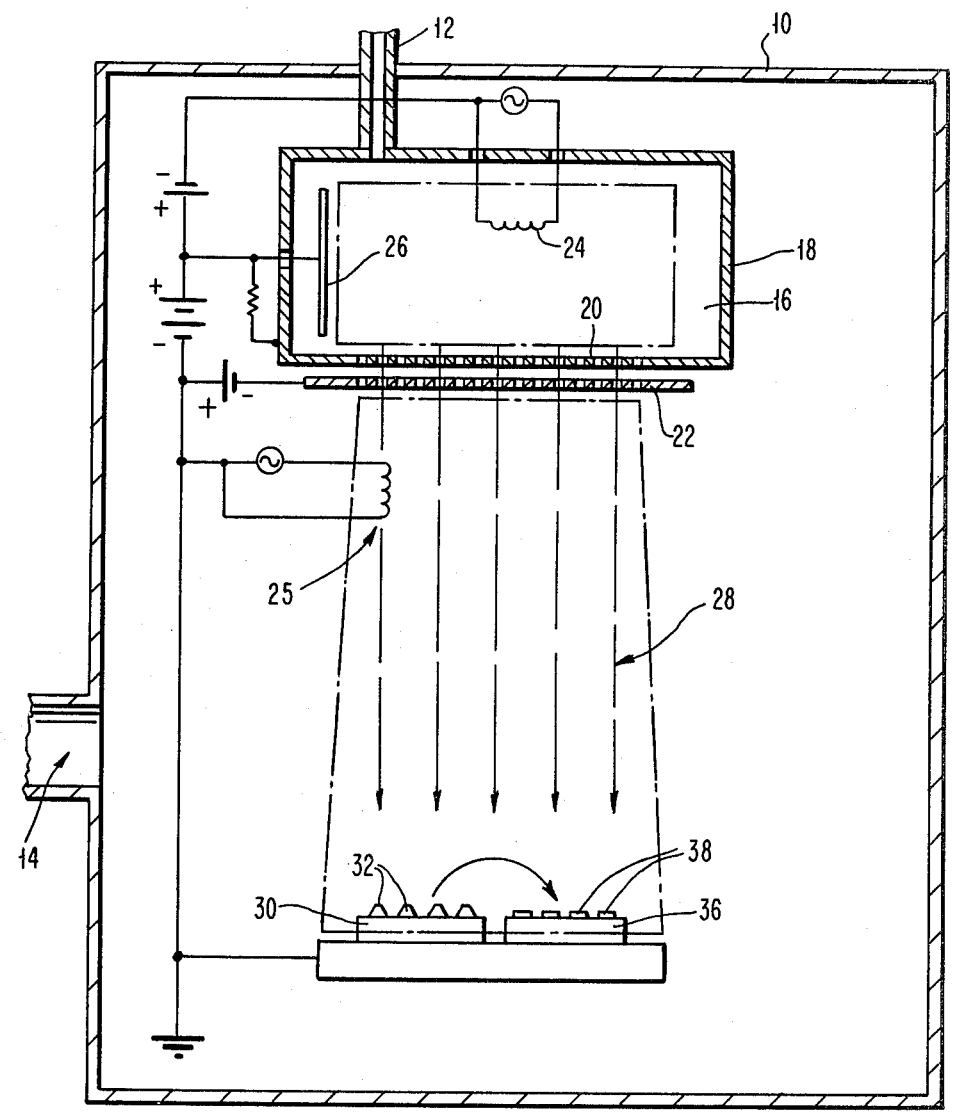
FIG. 1 is a schematic drawing of an ion beam source and apparatus.

In FIG. 1, there is shown the ion beam system which can be used to perform the present invention. The system is shown to be comprised of a vacuum chamber generally designated 10. The chamber 10 has an opening through which a gas conduit 12 is permitted to enter the system. It also has an opening 14 through which a vacuum can be created by means of a vacuum pump not shown. Situated within chamber 10 is the ion beam source comprising an ion generation chamber 16. Chamber 16 is formed by source body 18 and extraction grids 20 and 22. Within chamber 16 are the electrodes, cathode 24 and anode 26. In chamber 16, electrons from the hot filament (cathode 24) collide with gas atoms which are admitted into the chamber 16 via conduit 12. These collisions create ions. These ions are extracted and accelerated as they pass through grids 20 and 22 to form ion beam 28. The beam 28 is directed and impinged upon grounded specimen or chip 30. The charge of the ion beam 28 is neutralized by electrons emitted by a hot wire neutralizer 25 thereby allowing insulating specimens to be bombarded.

Referring to FIGS. 2.1 through 2.4, there is shown the progressive effects of exposure to ion beams on to solder pads on a silicon chip.

FIG. 2.1 shows a Si chip 30 having evaporated pyramidal solder pads 32 thereon. These pads are initially coated with a film 34 of oxide which grows by exposure to air. During exposure to ion beam 28 (FIG. 1), the oxide film 34 is removed (FIG. 2.2). This is hereafter referred to as a cleaning step. Upon further exposure solder 32 forms a hemispherical melt (FIG. 2.3). Just prior to joining Si chip 30 onto a substrate 36 having either solder pads or metal pads 38, which has been similarly exposed to ion beam 28, the beam 28 is turned off to permit solder 32 to form a solid as illustrated in FIG. 2.4.

In FIG. 3, there is shown the Si chip 30 joined to substrate 36. The Si chip 30 with its solid hemispherical solder 32 is flipped over onto substrate 36 with its matching solder or metal pads 38. The flipped over chip 30 is again exposed to ion beam 28, a time sufficient to effect joining of the chip to the substrate. (Heat may also be applied by auxiliary heating stage).

In operation, a silicon chip having a joining material thereon is conventionally prepared. Typically, joining materials contemplated by this invention includes those materials having softening and/or melting points below 1,000° C. These materials are capable of flowing and are thereby capable of joining with each other. Among the preferred materials are metals having relatively low melting point temperatures. Included among these materials are solders. Typically, the chips are prepared by evaporation solders prepared from lead tin, lead indium and lead bismuth alloys thereon.

For example, an alloy containing about 95% Pb and 5% Sn is found suitable for the purposes of the present invention. Similarly a substrate such as a ceramic substrate is prepared having corresponding metal lands or pads fashioned thereon. The so prepared chip and substrate are then placed in the ion beam generating system of FIG. 1. They constitute the target upon which the ion beam is trained. The system is then evacuated to about $10^{-6}$ Torr. It is then backfilled with a suitable gas. For example, the following gases may be used; argon, krypton, neon, xenon, mixtures of hydrogen and argon or forming gas in a mixture of hydrogen plug nitrogen. The system is backfilled to a pressure in the range of about $10^{-5}$ to about $10^{-4}$ Torr.

Typical operation parameters are anode 26, maintained at about 1000 V while cathode 24 is maintained at about 950 V. Screen grid 20 is kept at the same potential as cathode 24 while accelerator grid 22 is maintained at a potential of $-150$ V. Cathode 24 is heated to a temperature sufficient to effect electron emission. Typically, the cathode is fashioned from a 0.010 inch tungsten wire shaped in a circle 10 cm in diameter. A current of about 10 amperes to about 15 amperes is passed through the cathode to obtain the temperature needed to effect electron emission.

Ions are created by applying a voltage of from about 50 V to about 100 V across chamber 10 between anode 24 and cathode 24 (FIG. 1). Cathode 24 is heated to a temperature high enough for electron emission. (Typically 10-15 amp. for 0.010" tungsten wire in 10 cm diam. ion source).

The process can be performed stepwise i.e., the solder pads can be cleaned melted, solidified and subsequently joined to the matching metal or solder pads of the substrate. For example, in the cleaning step of the solder pads are exposed to ion beams of a density of typically 1000eV, 1.0mA/cm$^2$. They are melted within approximately 5 secs. to 20 secs. at an ion beam density of about 1.0 mA/cm$^2$. Solidification occurs by simply turning off the ion beam and permitting the irradiated solder pads to cool. This requires approximately 10 secs. The joining step requires that the Si chip be mechanically flipped onto the substrate so that the solder pads of the chip are in contact with matching pads on the substrate. The chip is then irradiated in an ion beam of about 1.0 mA/cm$^2$ to 10 mA/cm$^2$ density from about 20 secs. to about 200 secs.

In an alternate embodiment of the invention joining can be effective in a one step process. As shown in FIG. 4.1, two chips or a chip 30 and a substrate 36 are abutted so that solder pads 32 on each are matched and are in contact with each other. The abutting members are then exposed to ion beam radiation and joined as in FIG. 4.2. The intensity of the radiation is such that cleaning and melting is accomplished in a single exposure. For example, the density of the radiation is maintained from about 1 mA/cm$^2$ to about 10 mA/cm$^2$ at 1000eV and for a time of from about 5 secs to about 30 secs.

The above described methods have the advantages and capability of joining solder pads without flux and without significant electrical damage to components since heating is both local and rapid. The process can be stepwise because it uses a charged particle beam, which allows selective bombardment of conducting solder pads and minimal bombardment of insulating surfaces. This highly localizes the cleaning and heating process. This selective bombardment is accomplished by using low energy ions and applying a potential to pad lines, thereby precisely controlling ion bombardment by sequential biasing of the pads.

Having thus described our invention, what we claim as new, and desire to secure by Letters Patent is:

1. A process for fluxlessly joining members together including the steps of:
   (a) providing a first member having disposed a plurality of pads of a low melting material;
   (b) providing a second member having disposed a plurality of matching pads to which pads of said first member is to be joined;
   (c) simultaneously exposing said pads on said first and second members to an ion beam of sufficient energy and for a time sufficient to clean and melt said pads;
   (d) cooling said exposed pads to cause said pads to solidify;
   (e) placing the pads of said first member in juxtaposition to matching pads of said second member; and thereafter
   (f) exposing said pads to ion beam radiation of sufficient energy and for a time sufficient to cause said pads to reflow whereby upon cooling said matching pads are joined.

2. A method in accordance to claim 1 wherein said low melting material has a melting point of less than 1000° C.

3. A method in accordance to claim 1 wherein said low melting material is a solder alloy.

4. A method in accordance to claim 3 wherein said solder alloy is a PbSn alloy.

5. A method in accordance to claim 3 wherein said ion beam intensity step c is in the range of from about 1 mA/cm$^2$ to about 10 mA/cm$^2$.

6. A method in accordance to claim 5 wherein the time to clean and melt said pads is from about 1 sec to about 20 secs.

7. A method in accordance to claim 6 wherein the ion beam intensity in step f is from about 1 to about 10 1 mA/cm$^2$.

8. A method in accordance to claim 7 wherein the time in step f is from about 5 secs. to about 200 secs.

* * * * *

UNITED STATES PATENT AND TRADEMARK OFFICE
CERTIFICATE OF CORRECTION

PATENT NO. : 4,379,218

DATED : April 5, 1983

INVENTOR(S) : K. R. Grebe and J.M.E. Harper

It is certified that error appears in the above-identified patent and that said Letters Patent is hereby corrected as shown below:

Column 4, line 28, after "disposed" insert --thereon--;
line 30, after "disposed" insert --thereon--;
line 60, after "10" delete --1--.

Signed and Sealed this

Third Day of September 1985

[SEAL]

Attest:

DONALD J. QUIGG

Attesting Officer  Acting Commissioner of Patents and Trademarks - Designate